(12) United States Patent
Frenzel

(10) Patent No.: US 7,670,064 B2
(45) Date of Patent: Mar. 2, 2010

(54) OPTICAL MODULE AND OPTICAL SYSTEM

(75) Inventor: Henryk Frenzel, Regensburg (DE)

(73) Assignee: Siemens Aktiengeslschaft, Munich (DE)

( * ) Notice: Subject to any disclaimer, the term of this patent is extended or adjusted under 35 U.S.C. 154(b) by 129 days.

(21) Appl. No.: 10/573,539

(22) PCT Filed: Sep. 9, 2004

(86) PCT No.: PCT/EP2004/052096

§ 371 (c)(1),
(2), (4) Date: Mar. 27, 2006

(87) PCT Pub. No.: WO2005/031808

PCT Pub. Date: Apr. 7, 2005

(65) Prior Publication Data

US 2006/0239631 A1 Oct. 26, 2006

(30) Foreign Application Priority Data

Sep. 26, 2003 (DE) ................................ 103 44 767

(51) Int. Cl.
*G02B 6/36* (2006.01)
*G02B 3/00* (2006.01)
*G02B 9/00* (2006.01)

(52) U.S. Cl. .............................. 385/93; 385/88; 385/92; 359/642; 359/664

(58) Field of Classification Search ............. 385/88–89, 385/93

See application file for complete search history.

(56) References Cited

U.S. PATENT DOCUMENTS 4,055,761 A 10/1977 Shimomura

| | | | |
|---|---|---|---|
| 6,476,417 B2 | 11/2002 | Honda et al. | |
| 2001/0050717 A1* | 12/2001 | Yamada et al. | 348/340 |
| 2002/0047119 A1 | 4/2002 | Honda et al. | |
| 2003/0025825 A1* | 2/2003 | Nakajoh | 348/374 |
| 2003/0137595 A1 | 7/2003 | Takachi | |
| 2003/0193609 A1* | 10/2003 | Kothmeier | 348/340 |

FOREIGN PATENT DOCUMENTS

| | | | |
|---|---|---|---|
| DE | 196 51 260 A1 | | 1/1998 |
| DE | 102 21 892 A1 | | 5/2003 |
| DE | 10221892 A1 | * | 5/2003 |
| EP | 1 081 944 A2 | | 3/2001 |
| EP | 1081944 A2 | * | 3/2001 |
| EP | 1 122 945 A1 | | 8/2001 |
| JP | 63-52491 | | 3/1988 |
| JP | 2002135632 | | 5/2002 |

* cited by examiner

*Primary Examiner*—Frank G Font
*Assistant Examiner*—Erin D Chiem
(74) *Attorney, Agent, or Firm*—Laurence A. Greenberg; Werner H. Stemer; Ralph E. Locher

(57) ABSTRACT

An optical module has a lens holder with a lens assembly of, for example, three lenses and a diaphragm. The lenses and the optional diaphragm are unequivocally oriented by the geometrical form thereof such that no other optical adjustment is required. The optical module has a specially embodied circuit carrier with a thin region and a thick region that holds the thin, relatively sensitive region as in a frame, the thin region preferably carrying a semiconductor element. Along with the particularly low tolerances between the semiconductor element and the lens unit, the invention advantageously enables a more reliable assembly (e.g. soldering, gluing, etc.) of a semiconductor element, for example in flip-chip mounting technology, on a thin and thus relatively stable, flat plane, than comparable assembly processes of components on exclusively flexible circuit carriers. The optical module is particularly suitable for interior and exterior applications on motor vehicles.

17 Claims, 6 Drawing Sheets

OPTICAL MODULE AND OPTICAL SYSTEM

BACKGROUND OF THE INVENTION

Field of the Invention

The invention relates to an optical module having a circuit carrier, an unpackaged semiconductor device flip-chip-mounted on the circuit carrier, and a lens unit for projecting electromagnetic radiation onto the semiconductor device, the lens unit comprising a lens holder and a lens assembly with at least one lens.

The invention further relates to an optical system having an optical module implemented in this manner.

Generic optical modules and systems are used particularly in automotive engineering.

In this area, electromagnetic radiation from various frequency ranges can be used whereby, cumulatively to visible light which is typically employed by applications on the exterior of a motor vehicle such as lane departure warning (LDW), blind spot detection (BSD) or rear view cameras, particularly the infrared radiation invisible to humans is preferred for applications in the interior of a motor vehicle, such as out of position detection (OOP) or additional exterior lighting of a night vision system.

Because of external effects such as temperature, humidity, dirt and vibration, applications inside and outside a vehicle are subject to exacting requirements. The typical service life for in-vehicle systems is 10 to 15 years with only extremely low failure rates being tolerated, so that components of an optical system of the abovementioned type must also exhibit only very slow aging.

As space for mounting optical modules or optical systems is at a premium in many cases, additional difficulties exist for implementing the optical systems. Using conventional means, it is therefore extremely difficult to construct a reliable, hermetically sealed unit comprising a camera chip (currently CCD- or CMOS sensor) and associated optics.

For example, in systems of this kind which are used to record images or information, it is acknowledged that the optics must have their precise focal point at the point of conversion from light to information (e.g. film level, optical surface of CCD or CMOS sensor). The distance between the camera chip and optical system must either be set and fixed basically once during manufacture or the focal point is re-set for each image (focusing on object, not fading rays). This results in considerable manufacturing costs and also poses a quality risk.

For cost and quality assurance reasons, however, cameras for specific low cost application such as automotive, industrial, digital camera, cell phone, toy, etc. must be manufacturable as far as possible without adjustment processes between optical system and camera chip, i.e. without setting the focal point to the optical surface of the CMOS or CCD sensor. This is fundamentally contrary to the abovementioned requirements.

One possibility for developing a focus-free system is to reduce the sum of the possible tolerances and devices so that the module or system is designed to operate without adjustment at least within a particular distance or temperature range. If the invention is used e.g. as part of a motor vehicle's occupant protection system (to which, however, the present invention is not limited), sharp images at distances of e.g. 15 to 130 cm and temperatures of e.g. −40 to +105° C. must be ensurable. This is more readily implementable the smaller the number of devices included in the tolerance chain. The circuit carrier for the camera chip (e.g. CCD or CMOS) constitutes a major portion of the tolerance chain. Thus, for example, by using very thin, so-called flexible printed boards it is attempted to introduce only a small thickness tolerance. In addition, the necessary soldered or in some cases glued joints between chip and circuit carrier in particular account for a large portion of the tolerance chain.

However, this solution, in particular the mounting of a semiconductor device on a flexible printed board, also has its disadvantages. For example, it makes handling such as squeegeeing, component placement, soldering, separating, etc. more difficult; the torsional stiffness and therefore the process reliability is often worse than with so-called printed circuit boards (PCBs), molded interconnect devices (MIDs) or similarly implemented circuit carriers which, however, make a considerable contribution to the tolerance chain depending on their thickness dimensions. In addition, there are disadvantages in terms of EMC behavior.

SUMMARY OF THE INVENTION

The object of the invention is to provide an optical module and an optical system having an unpackaged semiconductor device disposed on a circuit carrier, wherein the EMC disadvantage is eliminated and/or the thickness tolerance of the necessary circuit carrier is minimized as far as possible, so that reliable optical quality can be provided without adjustment and in particular focusing complexity and maintained over the service life of the module or system which can be easily and inexpensively assembled. Lastly, particular measures shall guarantee process-safe fabrication with ease of handling.

This object is achieved by the features set forth in the independent claims. Advantageous embodiments of the invention, which can be used individually or in combination with one another, are set forth in the dependent claims.

The invention is based on the generic optical module in that the circuit carrier itself has at least one thin region and a thick region supporting the thin, relatively sensitive region. Due to the spatial closeness of a thick region, a circuit construction of this kind has advantages over a pure flex solution in terms of EMC behavior. In addition, it advantageously combines a minimized tolerance dimension with greatly increased torsional stiffness.

According to the invention, the lens holder is preferably disposed in a supported manner in the thin region of the circuit carrier so as to ensure a defined reference dimension between the lens holder or lens unit and the circuit carrier.

According to the invention, the semiconductor device is also preferably disposed in or adjacent to a thin region of the circuit carrier, thereby allowing a manufacturing technology with ease of handling and ensuring particularly tight tolerances between the semiconductor device, or more precisely camera chip, and the lens unit. The thin region of the circuit carrier is advantageously supported by the thick region. This allows the semiconductor device to be mounted (e.g. soldered, glued or similar) e.g. by means of flip-chip technology on a thin but relatively stable, torsionally stiff level plane, thereby advantageously ensuring process-safer manufacturing than in the case of comparable processes for mounting components on exclusively flexibly implemented circuit carriers.

According to the invention, the thick region is preferably made U-shaped in order to adequately support the thin region. In an alternative embodiment, however, the thin, relatively sensitive region is preferably supported in a clamped manner, as in a frame, by a surrounding thick region. Other embodiments are conceivable, as long as they support or clamp the thin region, such as L-shaped, partially U-shaped, F- or E-forked or similarly implemented thick regions.

The thick region is preferably rigidly implemented, e.g. as a multilayer FR-4 printed circuit board (PCB) or the like.

Particularly for these materials, an appropriate solution is to implement the thin first region of the circuit carrier by recessing or milling out.

In an alternative development of the invention, the thin and thick regions are implemented as a molded interconnect device (MID) with integrated conductor tracks. MID technology is essentially based on the use of hightemperature thermoplastics which are metallized to form circuit patterns. MIDs, i.e. 3-dimensional injection-molded circuit carriers, are molded parts with integrated conductor patterns. Attention is drawn particularly to the rationalization potential of MID patterns, in which context mention should also be made of the environmental compatibility achieved compared to conventional circuit carriers. MIDs can be produced in various ways, such as fabricating the circuit carrier by one-shot injection molding, metallization then taking place by means of hot-embossing and the pattern then being created by mold stamping. Likewise, one-shot injection molding can be followed by metallization by electroplating. Following metallization, whether it be by hot-embossing or electroplating, a pattern can be also be created by 3D-masking or an imaging laser process. The inventive circuit carrier having at least two regions can also be fabricated by other plastic-processing methods, such as two-shot injection molding, for example. The metallization and patterning of the MID can also be performed in an integrated manner by means of a conductor pattern foil. The abovementioned methods for manufacturing MIDs should only be taken as examples of a number of known prior art methods, MIDs manufactured in whatever manner being able to be used within the scope of the present invention.

According to the invention the thin region is preferably implemented as a flexible PCB or similar and the thick region as a rigid PCB or similar. By means of the preferred implementation of the thin region as a flexible printed board or so-called flex foil, this meets all the requirements that a circuit carrier supporting the semiconductor device must satisfy within the scope of the present invention, namely little or no creation of additional uncertainties in respect of the optical design, for which reason in particular flexible circuit boards with as tight tolerances as possible must be used.

Relating specifically to the present invention, the abovementioned embodiments of a first and second region of the circuit carrier offer in approximately equal measure the possibility of using a manufacturing technology with particularly low tolerances between the semiconductor device and lens unit disposed in or adjacent to the thin region of the circuit carrier. The tolerance chain which in the case of conventional designs is extended still further by the thickness of the circuit carrier and the thickness of any stabilizing devices provided, is advantageously reduced to a minimum within the scope of the present invention.

According to the invention there are preferably implemented on the lens holder, at least partially, support elements via which the lens holder and therefore the lens unit bear a relationship to the circuit carrier in a defined dimension with respect to the optical system. The lens unit and circuit carrier are interconnected in an otherwise normal manner, preferably adjacently to the support elements, specifically glued, laser-welded, screwed, riveted or similar, a connection thereby being provided by means of the standoffs between circuit board and lens holder or lens unit, which connection causes no additional uncertainty in respect of the optical quality of the module.

In an alternative embodiment of the present invention, the thick second region of the circuit carrier is part of the lens unit or, more precisely, of the lens holder, said lens holder preferably being implemented as an MID (molded interconnect device) with integrated conductor tracks. In this way the number of components required is again reduced—while retaining the inventive supporting of the thin region. Due to the fact that, if the lens holder is implemented as an MID, conductor tracks are incorporated, the semiconductor device can be directly soldered or glued adjacently to or into the thin region of the lens holder. And even if the first thin region is implemented by means of flex-foil, a manufacturing technology with particularly tight tolerances between the semiconductor device and the lens unit is provided. In addition, the supporting according to the invention results in a relatively stable, planar thin region, which makes component placement, mounting or the like particularly easy.

The semiconductor device is preferably disposed on the side of the circuit carrier facing away from the lens unit, the thin region in the circuit carrier having an opening through which electromagnetic radiation is projected by the lens assembly onto the semiconductor device. The optical module is therefore constructed in the following sequence: lens assembly/circuit carrier (or more precisely flexible printed board)/semiconductor device. Even if embodiments are conceivable in which the order of circuit carrier and semiconductor device is reversed, it has been found particularly advantageous for the circuit carrier to be provided with an opening, thereby allowing the first-mentioned sequence.

The invention additionally consists of an optical system with an optical module of the above kind. In this way the advantages of the optical module also emerge as part of an overall system.

The invention is based on the recognition that it is possible to provide a compact, highly integrated module solution with minimal dimensional variations which avoids the abovementioned prior art disadvantages and, in particular, can be manufactured in a more process-safe manner, can be mounted more easily and is consequently particularly inexpensive.

It succeeds in providing various functionalities while simultaneously minimizing dimensions.

The optical module and the optical system are virtually maintenance-free. Also particularly relevant to cost savings is the fact that no optical adjustment of the optical module is required, as this is now better provided by the geometrical configuration of the components and as the tolerance chain is shortened by minimizing the circuit carrier tolerance to one dimension while at the same time improving handling in production engineering terms.

The module is stable and of high quality; moreover, an integrated modular solution for sensor and optical system is provided. This modularity means that the number of variants is reduced, which is consonant with the interchangeable part concept constantly striven for.

All in all, an integrated solution comprising sensor and optical system as well as possibly lighting and/or heating equipment is provided which uses a particularly inexpensive connection between optical module and main board.

The invention can be particularly usefully employed for implementing video systems, possibly in combination with radar systems, ultrasonic systems or the like in the automotive field.

The invention will now be explained using examples with reference to the accompanying drawings based on preferred embodiments:

DESCRIPTION OF THE PREFERRED EMBODIMENTS

Figure 1:
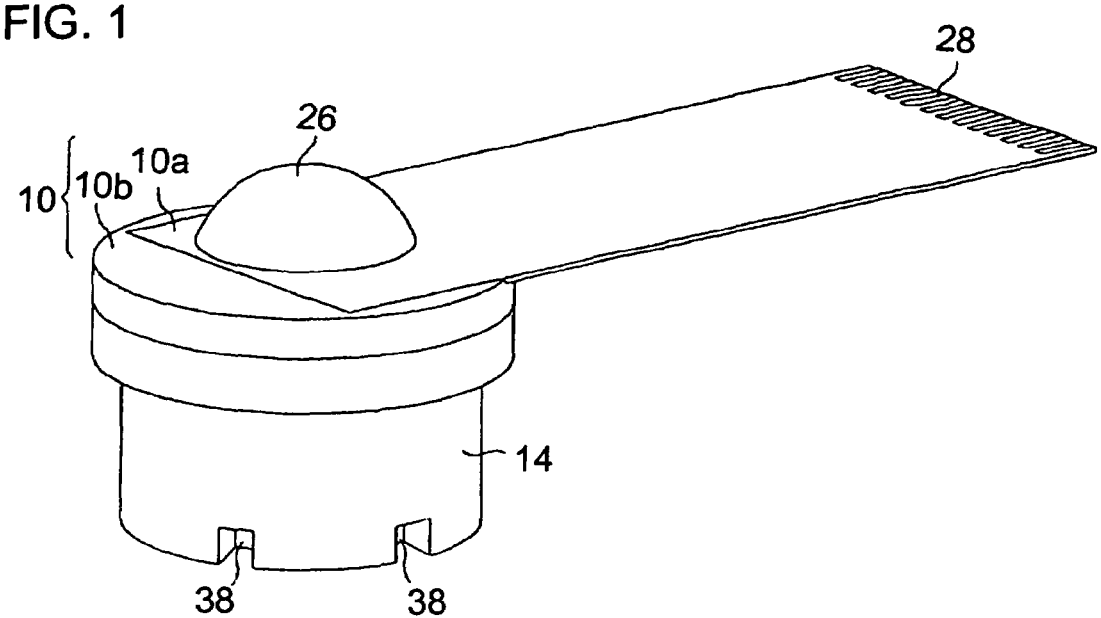
FIG. 1 shows a first perspective view of an optical module according to the invention.

In the following description of the preferred embodiments of the present invention, the same reference numerals are used to denote identical or comparable components.

FIG. 1 shows a perspective view of an optical module according to the invention. In the assembled state of the optical module shown are a lens holder 14 and a circuit carrier 10 comprising a first thin region 10a and a second thick region 10b. Under the also recognizable glob top 26 there is disposed a light-sensitive semiconductor device (not shown) which is installed here as a flip-chip 12, which has the advantage that no additional tolerances are added within the sensor or component (e.g. carrier chip, adhesive, etc.). The opposite end of the thin region 10a of the circuit carrier 10 is provided with solder pads 28, so that a contact can be established between the optical module and a rigid circuit board (not shown), e.g. by hot-bar soldering using the solder pads 28, without having to provide an additional electrical connection. Alternatively, depending on the design of the circuit carrier 10 and/or expediency, an appropriate electrical connection can also be implemented by a ribbon cable 36, as shown e.g. in FIG. 2. The side of the optical module opposite the glob top 26 is provided with cutouts and light emitting diodes 38 disposed therein.

Figure 2:
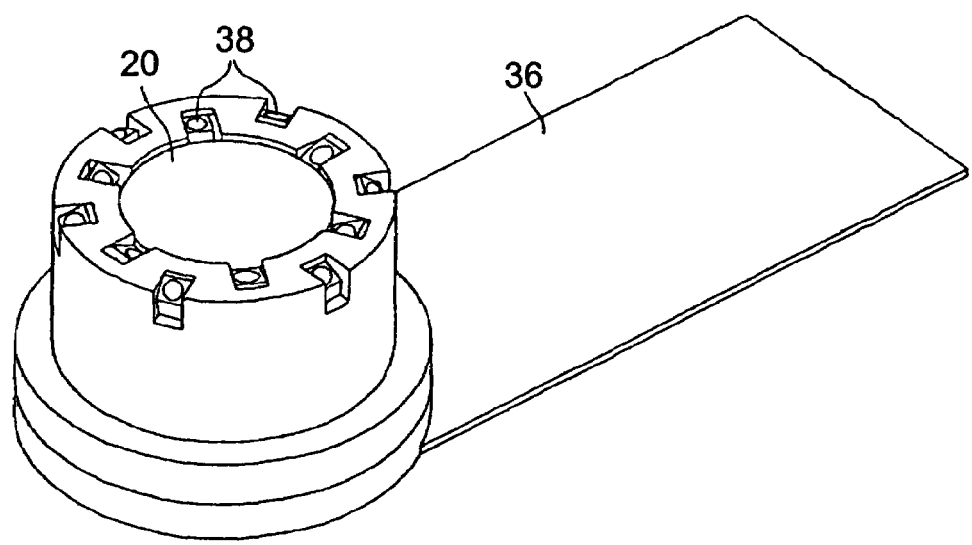
FIG. 2 shows a second perspective view of an optical module according to the invention.

FIG. 2 is a second perspective view of an optical module according to the invention, showing a special alternating arrangement of the light emitting diodes 38 around a lens 20 provided for the admission of radiation.

Figure 3:
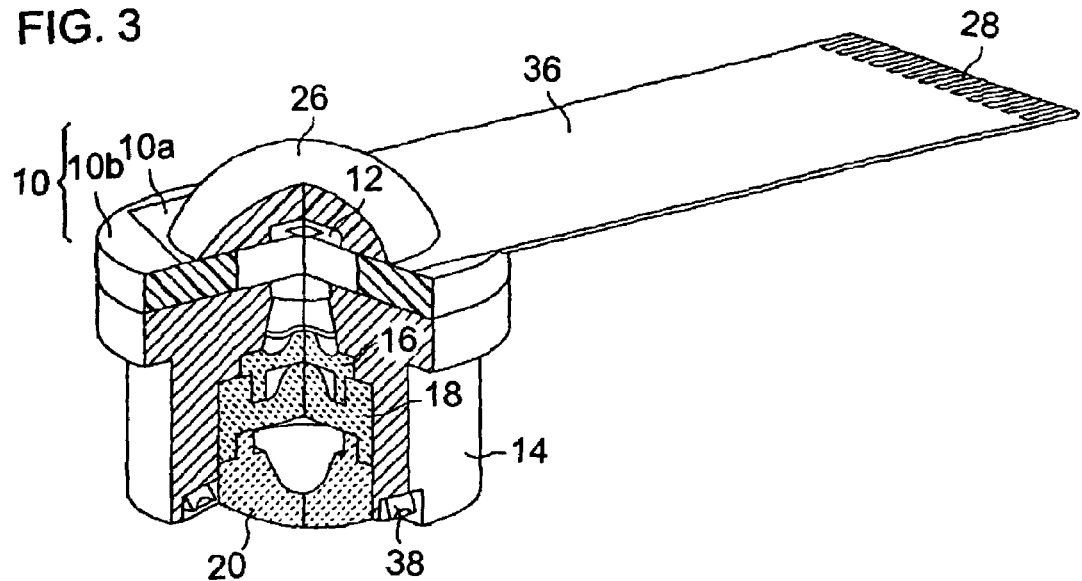
FIG. 3 shows a third perspective, partially sectional view of an optical module according to the invention.

FIG. 3 is a perspective, partially sectional view of an optical module according to the invention, showing the interior of the lens holder 14. For the description of this arrangement, reference is simultaneously made to FIG. 6 which contains an exploded view of the optical module according to the invention, and to FIG. 7 which shows the optical module in side elevation but with a lens assembly 16, 18, 20 enlarged to include a diaphragm 21.

Figure 7:
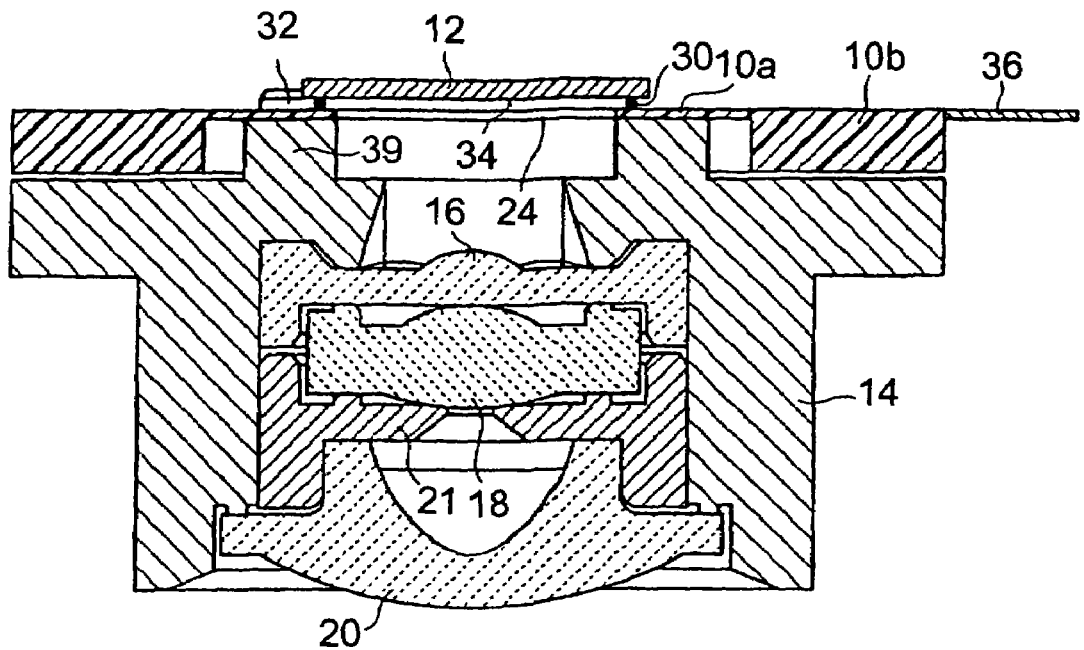
FIG. 7 shows a first sectional view of an optical module according to the invention.

In the lens holder 14 according to FIG. 3, three lenses 16, 18, 20 are inserted. The lenses 16, 18, 20 and the diaphragm 21 shown in FIG. 7 are shaped in such a way that they assume a defined position relative to one another inside the lens holder 14. In addition, one of the lenses is so designed that it interacts with the lens holder 14, thereby also adopting a defined position with respect to the lens holder 14 and ultimately to the semiconductor device 12. In this way all the lenses 16, 18, 20 are adjusted with respect to the semiconductor device 12. This adjustment is unaffected by other measures, as the lens holder 14 is disposed directly in the thin region 10a of the circuit carrier on top of same.

The connection between the semiconductor device 12 and the circuit carrier 10a is established using a flip-chip technique by creating a soldered joint via solder bumps 30. The joint can then be strengthened with an underfill. To ensure that electromagnetic radiation can pass from the lens assembly 16, 18, 20; 21 disposed on the side facing away from the populated surface of the circuit carrier 10 to the semiconductor device 12, the thin region 10a has an opening 24. Through this opening 24, electromagnetic radiation can 11 reach an electromagnetic radiation sensitive surface 34 of the semiconductor device 12.

The semiconductor device 12 can—according to present day technology—be designed as CMOS or CCD. In addition to or alongside the soldered joint 30, an adhesive bond can also be provided. An underfill (not shown) can be applied for strengthening. In order to protect the expensive semiconductor device 12 against environmental effects and/or unwanted light radiation from behind, a glob top 26 is provided. In order to allow ventilation of the optical module in the event of in particular severe temperature fluctuations, a ventilation opening can be provided. It is likewise possible to dispose an adhesive pressure compensation seal (PCS) on an opening (not shown).

According to the invention, the optical module has a specially implemented circuit carrier 10, comprising a thin region 10a and a thick region 10b supporting the thin, relatively sensitive region 10a as in a frame, the thin region 10a preferably carrying a semiconductor device 12.

Figure 4:
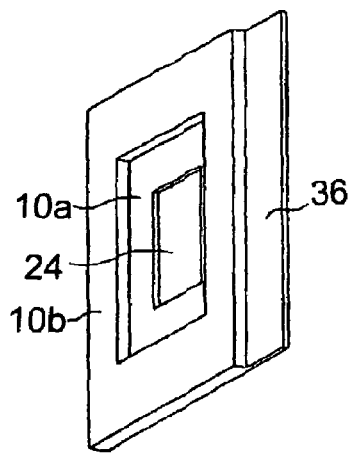
FIG. 4 shows a first embodiment of a circuit carrier of the module according to the invention, comprising a thin region and a frame-shaped thick region.

FIG. 4 shows a first embodiment of a circuit carrier 10 of the module according to the invention, comprising a thin region 10a and a frame-shaped thick region 10b.

Figure 5:
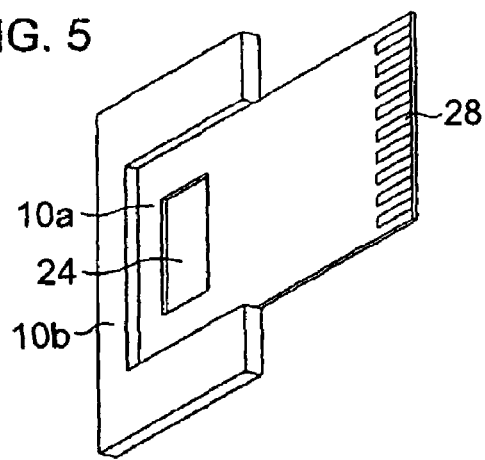
FIG. 5 shows a second embodiment of a circuit carrier of the module according to the invention, comprising a thin region and a U-shaped thick region.

FIG. 5 shows a second embodiment of a circuit carrier 10 of the module according to the invention, comprising a thin region 10a and a U-shaped thick region 10b.

It is clearly discernible how the thin region 10a is advantageously supported by the U-shaped and frame-shaped 11 thick region 10b respectively.

Figure 6:
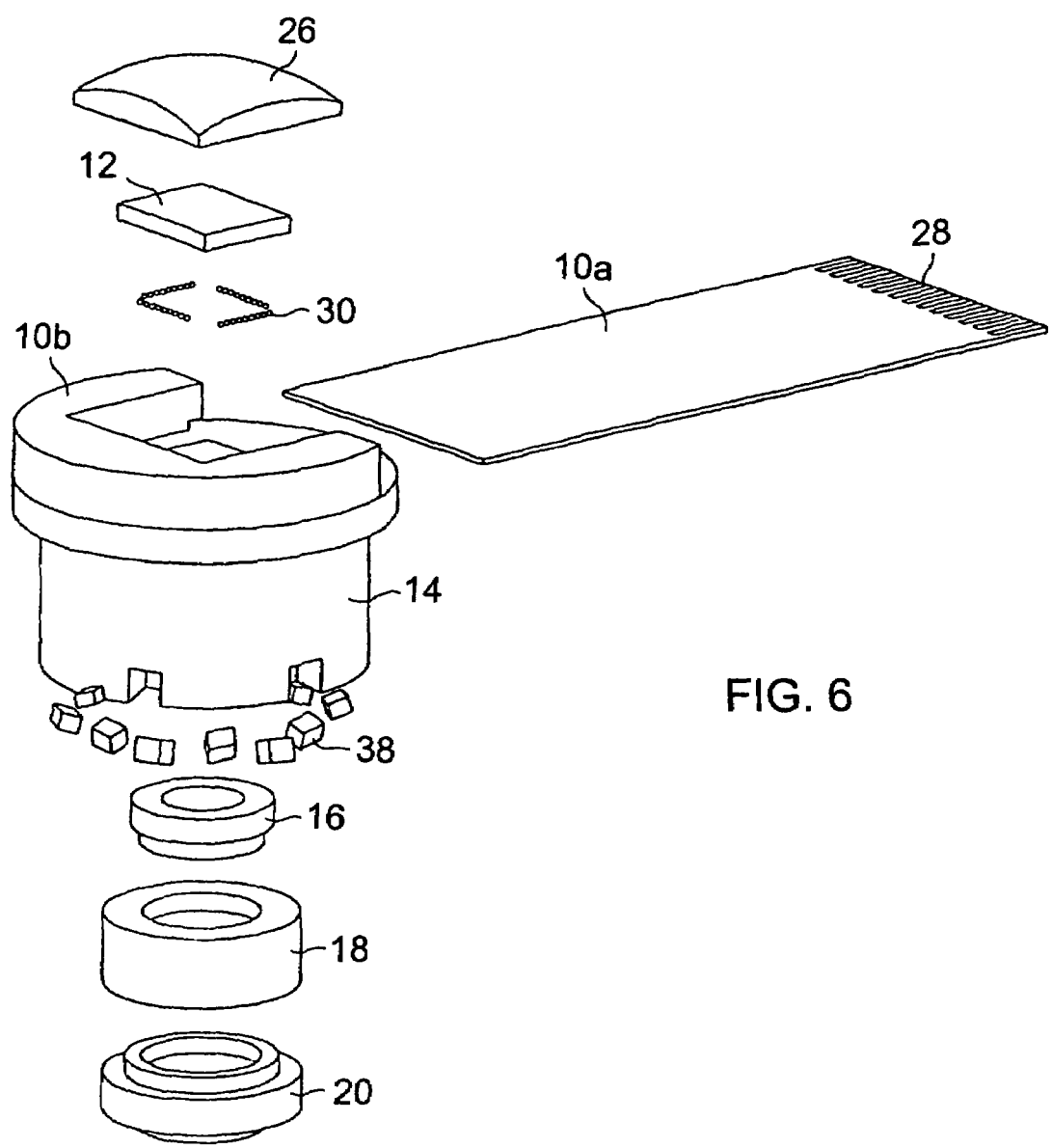
FIG. 6 shows an exploded perspective view of an optical module according to the invention.

FIG. 6 shows an exploded perspective view of the optical module according to the invention including the light emitting diodes 38, the alternating arrangement being clearly illustrated in FIG. 6.

FIG. 7 shows an optical module with a lens unit, comprising a lens holder 14 into which a lens assembly consisting e.g. of three lenses 16, 18, 20 and a diaphragm 21 is inserted. The lenses 16, 18, 20 and the diaphragm 21 are preferably unambiguously oriented to one another and relative to the lens holder 14 by their geometrical configuration, so that no further optical adjustment of the system is required. The thick region 10b of the circuit carrier 10 supports a first region 10a, e.g. a flex foil, which carries an electromagnetic radiation sensitive semiconductor device 12. As the lens holder 14 in the thin region 10a of the circuit board 10, which at the most has a very small tolerance, is connected to the circuit carrier 10 e.g. via a screwed or adhesive connection or the like, the semiconductor device 12 is also positioned in a defined manner relative to the other optical devices, i.e. in particular the lenses 16, 18, 20.

Guide devices and/or bores 32 or the like implemented e.g. on the lens holder 14 finally facilitate precise positioning of circuit carrier 10 to lens unit 14 or vice versa.

For implementing the thick 10b region and the thin region 10a various designs are conceivable, in particular rigid and flexible PCB, multilayer FR4 and thin PCB, milling out to a precise dimension, implementation in MID or the like. In all cases, the thin, relatively sensitive region 10a is supported or clamped by the at least partially surrounding relatively rigid region 10b as in a frame. The low tolerance between PCB top- and underside are achieved by the thin region 10a of the circuit carrier, possibly in combination with additional measures such as matched lens systems, etc.

Figure 8:
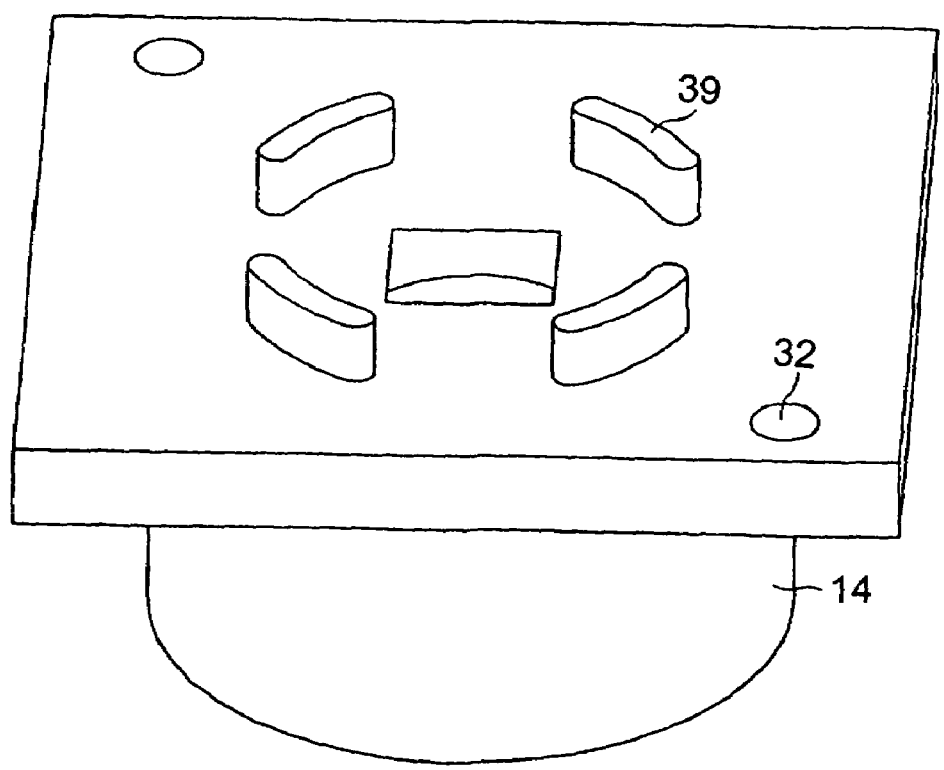
FIG. 8 shows a first lens holder of an optical module according to the invention with partially implemented support elements.
Figure 9:
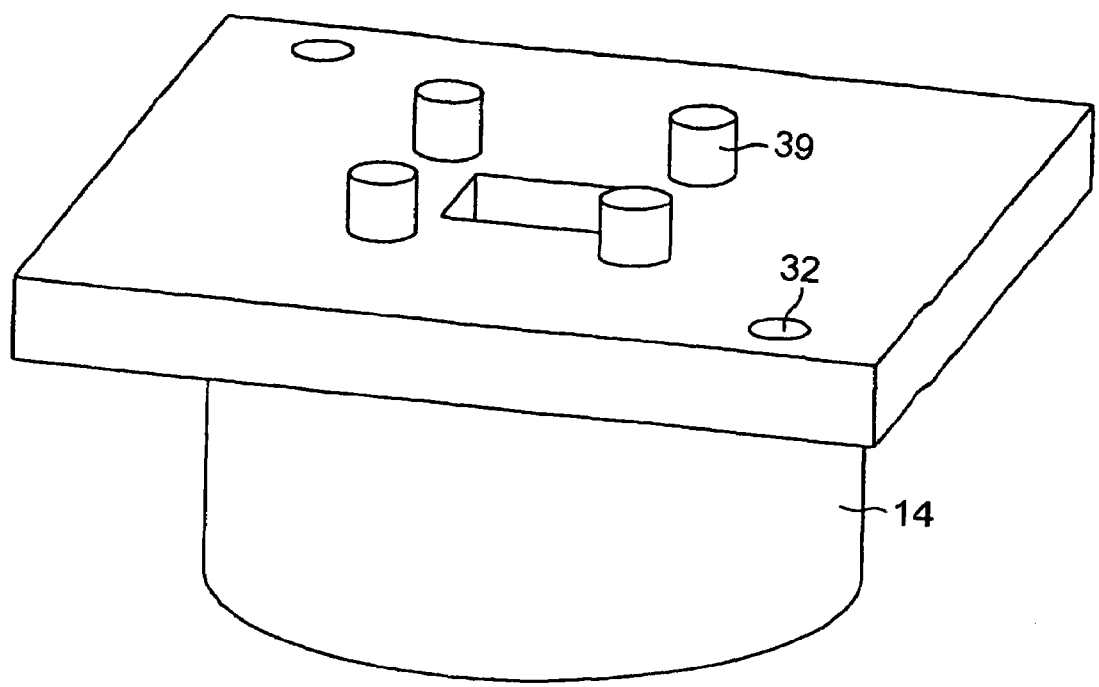
FIG. 9 shows a second lens holder of an optical module according to the invention with alternatively partially implemented support elements.

Contact between lens holder 14 and circuit carrier 10 is established in the thin region 10a. In this connection, FIGS. 8 and 9 show a lens holder with partial supports 39.

Figure 10:
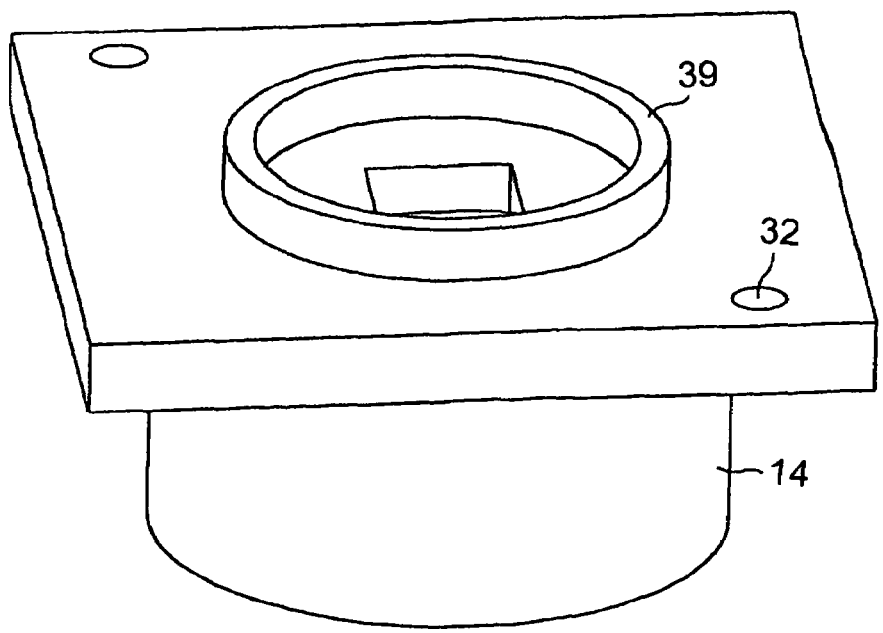
FIG. 10 shows a third lens holder of an optical module according to the invention with a circumferential support ring.
Figure 11:
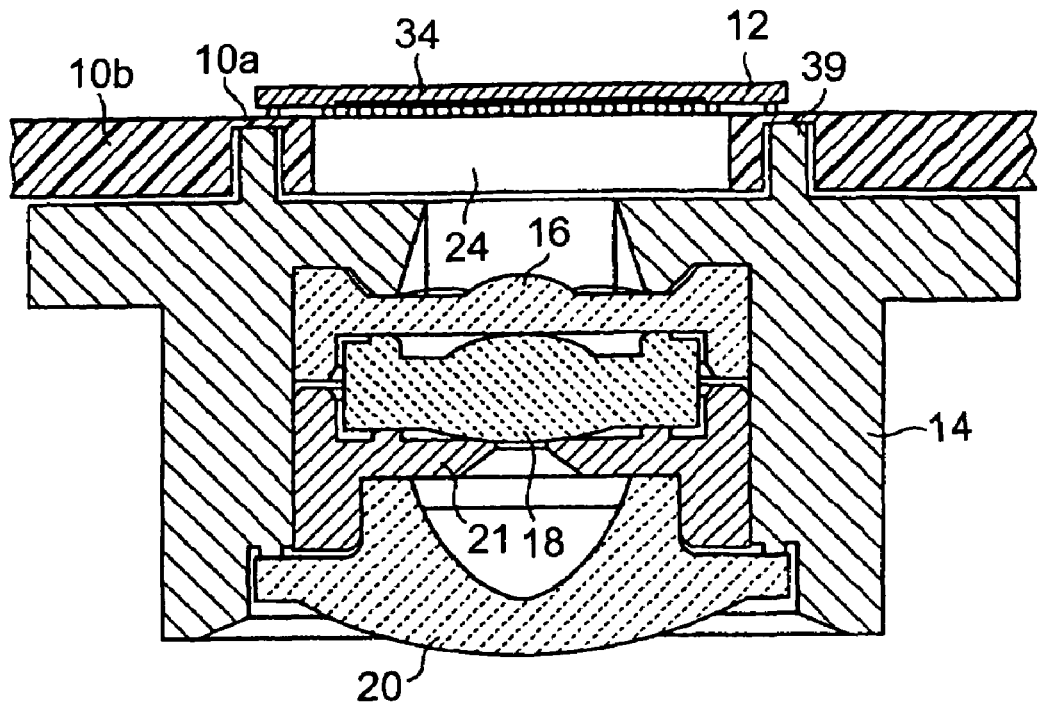
FIG. 11 shows a second side view of an optical module with a lens holder according to FIG. 10.

FIG. 10 shows a lens holder 14 with a circumferential support ring 39 which simultaneously seals the lens unit 14; 16, 18, 20; 21 to the circuit carrier 10 and vice versa in an advantageous manner. This is shown in FIG. 11 in a sectional view.

Figure 12:
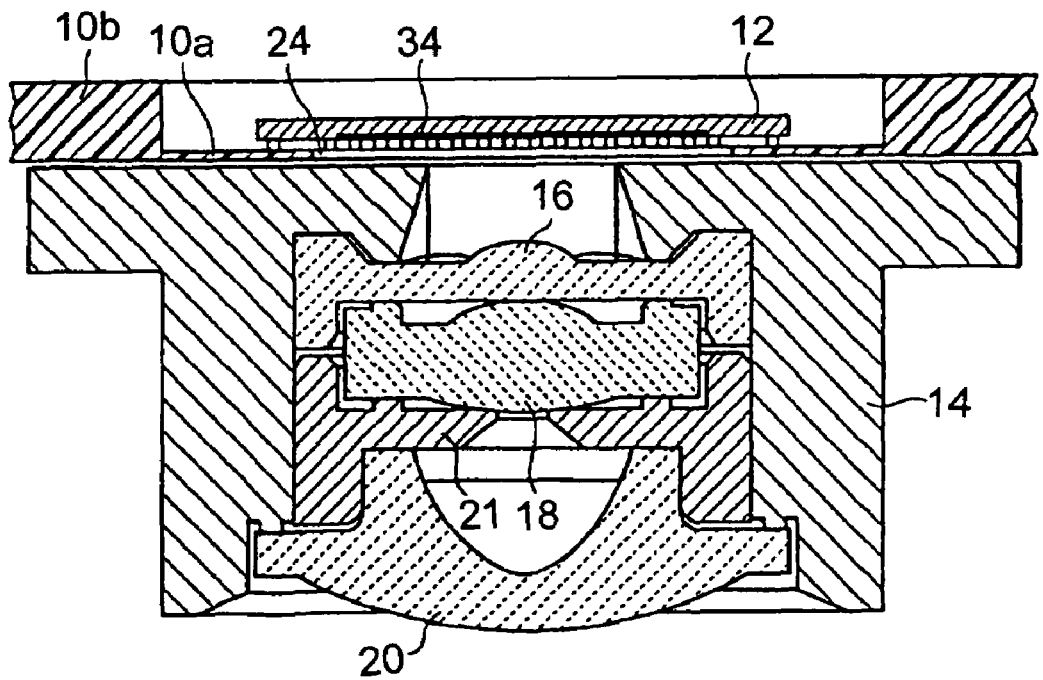
FIG. 12 shows a third side view of an optical module according to the invention.

FIG. 12 lastly shows a circuit carrier 10 implemented according to the invention with a recess 10a in the direction of the flip-chip 12. In this embodiment, advantageously no support elements need to be implemented on the lens holder 14. A circuit carrier 10 of this kind also provides improved EMC behavior.

The present invention advantageously allows flip-chip devices 12 to be mounted to a thin, stably supported flat plane 10a. In addition to easy panel processing, they also enable in particular several layers around the flip-chip to be used, e.g. FR4 layers, which has a positive effect on electromagnetic compatibility (EMC) and on so-called routing. It also advantageously allows integration of flip-chip carriers and electronics unit on a single circuit carrier 10.

The features of the invention disclosed in the above description, in the drawings and in the claims can be essential to the implementation of the invention both individually and in any combination. It is particularly suitable for applications in the interior and/or exterior of a motor vehicle.

I claim:

1. An optical module, comprising:
   a circuit carrier;
   a non-packaged semiconductor device flip-chip mounted on said circuit carrier;
   a lens unit disposed for projecting electromagnetic radiation onto said semiconductor device, said lens unit including a lens holder and a lens assembly with at least one lens;
   said circuit carrier having at least one relatively thin region and a relatively thick region supporting said thin region;
   said thick region being a rigid portion of said circuit carrier and a rigid portion of a multilayer printed circuit board;
   said lens holder being supported in said thin region of said circuit carrier and disposed directly on said thin region; and
   said semiconductor device being disposed on an opposite side of said circuit carrier with respect to said lens holder and in said thin region of said circuit carrier.

2. An optical module, comprising:
   a circuit carrier;
   a non-packaged semiconductor device flip-chip mounted on said circuit carrier;
   a lens unit disposed for projecting electromagnetic radiation onto said semiconductor device, said lens unit including a lens holder and a lens assembly with at least one lens;
   said circuit carrier having at least one relatively thin region and a relatively thick region supporting said thin region, said thick region defines defining a frame at least;
   said lens holder is disposed directly on said thin region;
   said thick region being a rigid portion of said circuit carrier and a rigid portion of a multilayer printed circuit board.

3. The optical module according to claim 2, wherein said semiconductor device is disposed in or adjacent said thin region of said circuit carrier.

4. The optical module according to claim 1, wherein said thick region is at least partially U-shaped, L-shaped, F-forked, or E-forked or frame-shaped.

5. The optical module according to claim 1, wherein said thick region is a rigid portion of an Flame Retardant 4 circuit board.

6. The optical module according to claim 1, wherein said thin region is a recessed or milled-out portion of said circuit carrier.

7. The optical module according to claim 1, wherein said thin region is a flexible printed circuit board and said thick region is a rigid printed circuit board.

8. The optical module according to claim 1, which further comprises support elements at least partially formed on said lens holder.

9. The optical module according to claim 1, wherein said lens holder is connected, in particular glued, laser-welded, screwed or riveted, to said circuit carrier, preferably adjacently to the support elements.

10. The optical module according to claim 9, wherein said lens holder is glued, laser-welded, screwed, or riveted to said circuit carrier.

11. The optical module according to claim 9, wherein said lens holder is connected to said circuit carrier adjacent support elements mounted to said lens holder.

12. The optical module according to claim 1, wherein said thick region of said circuit carrier forms a part of said lens unit.

13. The optical module according to claim 12, wherein said thick region of said circuit carrier forms a part of said lens holder and said lens holder is an molded interconnect device with integrated conductor tracks.

14. The optical module according to claim 1, wherein:
   said semiconductor device is disposed on a side of said circuit carrier facing away form said lens unit; and
   said thin region of said circuit carrier is formed with an opening enabling through-projection of electromagnetic radiation from said lens assembly onto said semiconductor device.

15. An optical system, comprising at least one optical module according to claim 1.

16. An optical module, comprising:
   a circuit carrier;
   a non-packaged semiconductor device flip-chip mounted on said circuit carrier;
   a lens unit disposed for projecting electromagnetic radiation onto said semiconductor device, said lens unit including a lens holder and a lens assembly with at least one lens;

said circuit carrier having at least one relatively thin region and a relatively thick region supporting said thin region, said thin region being a flexible printed circuit board and said thick region being a rigid portion of a multilayer printed circuit board, said lens holder being disposed directly on said thin region;

said semiconductor device being disposed on an opposite side of said circuit carrier with respect to said lens holder and in said thin region of said circuit carrier.

17. The optical module according to claim 2, wherein said lens holder is supported in said thin region of said circuit carrier.

* * * * *